(12) United States Patent
Jung et al.

(10) Patent No.: US 12,040,209 B2
(45) Date of Patent: Jul. 16, 2024

(54) ELECTROSTATIC CHUCK HEATER AND MANUFACTURING METHOD THEREFOR

(71) Applicant: MICO CERAMICS LTD., Anseong (KR)

(72) Inventors: Chul Ho Jung, Pyeongtaek (KR); Jin Young Choi, Anseong (KR)

(73) Assignee: MICO CERAMICS LTD., Anseong (KR)

( * ) Notice: Subject to any disclaimer, the term of this patent is extended or adjusted under 35 U.S.C. 154(b) by 876 days.

(21) Appl. No.: 16/770,006

(22) PCT Filed: Jan. 24, 2019

(86) PCT No.: PCT/KR2019/001029
§ 371 (c)(1),
(2) Date: Apr. 16, 2021

(87) PCT Pub. No.: WO2019/168271
PCT Pub. Date: Sep. 6, 2019

(65) Prior Publication Data
US 2021/0242062 A1    Aug. 5, 2021

(30) Foreign Application Priority Data
Feb. 28, 2018   (KR) .................. 10-2018-0024661

(51) Int. Cl.
*H01L 21/683*    (2006.01)
*C23C 16/458*    (2006.01)
(Continued)

(52) U.S. Cl.
CPC ...... *H01L 21/6833* (2013.01); *C23C 16/4586* (2013.01); *H01J 37/32724* (2013.01); *H01L 21/67103* (2013.01); *H01J 2237/3323* (2013.01)

(58) Field of Classification Search
CPC .......... H01L 21/6833; H01L 21/67103; H01L 21/6733; H01L 21/6831; C23C 16/4586;
(Continued)

(56) References Cited

U.S. PATENT DOCUMENTS 5,452,510 A    9/1995  Barnes et al.
10,522,374 B2 * 12/2019 Kim ...................... H02N 13/00
(Continued)

FOREIGN PATENT DOCUMENTS

CN    101278385 A      10/2008
CN    106575634 A  *   4/2017  .......... H01L 21/324
(Continued)

OTHER PUBLICATIONS

Aramaki Toru; JP-2004-259721; Sample Treating Device; Entire specification and drawings (Year: 2004).*
(Continued)

*Primary Examiner* — Dharti H Patel

(57) ABSTRACT

The present invention relates to an electrostatic chuck heater and a manufacturing method therefor and, more particularly, to an electrostatic chuck heater comprising: a ground electrode; and an electrostatic chuck electrode spaced a predetermined distance apart from the outside of the ground electrode, wherein the heater can reduce the phenomenon of rising of a wafer edge and thus can significantly reduce the temperature deviation according to positions on a heating surface of an object, such as a wafer, so as to increase the temperature uniformity of the heating surface.

19 Claims, 10 Drawing Sheets

(51) Int. Cl.
*H01J 37/32* (2006.01)
*H01L 21/67* (2006.01)

(58) Field of Classification Search
CPC ............... C23C 16/4581; C23C 16/46; H01J 37/32724; H01J 2237/3323
USPC .............................................. 361/234
See application file for complete search history.

(56) References Cited

U.S. PATENT DOCUMENTS

| | | |
|---|---|---|
| 2002/0139563 A1 | 10/2002 | Fujii et al. |
| 2005/0258160 A1 | 11/2005 | Goto et al. |
| 2007/0297118 A1* | 12/2007 | Fujii ............... H02N 13/00 361/234 |
| 2009/0178764 A1 | 7/2009 | Kanno et al. |
| 2009/0314433 A1* | 12/2009 | Hoffman ........... H01L 21/6833 156/345.48 |
| 2012/0250212 A1 | 10/2012 | Kimura et al. |
| 2015/0181683 A1* | 6/2015 | Singh ............... H01L 21/6833 361/234 |
| 2016/0322242 A1* | 11/2016 | Nguyen ............. H01J 37/321 |

FOREIGN PATENT DOCUMENTS

| | | | |
|---|---|---|---|
| JP | 2000-277595 A | 10/2000 | |
| JP | 2001-319967 A | 11/2001 | |
| JP | 2002-293655 A | 10/2002 | |
| JP | 2004022979 A | 1/2004 | |
| JP | 2004-259721 A | 9/2004 | |
| JP | 2007-311399 A | 11/2007 | |
| JP | 2008-251737 A | 10/2008 | |
| JP | 2009-170509 A | 7/2009 | |
| JP | 2015-135960 A | 7/2015 | |
| JP | 2017-212375 A | 11/2017 | |
| JP | 2023067767 A * | 5/2023 | ........ H01J 37/32724 |
| KR | 100655813 B1 | 12/2006 | |
| KR | 10-2007-0092060 A | 9/2007 | |
| KR | 101397133 B1 | 5/2014 | |
| KR | 101813289 B1 | 12/2017 | |
| KR | 10-2019-0079473 A | 7/2019 | |
| WO | WO-2010047311 A1 * | 4/2010 | ........... B23Q 17/002 |
| WO | WO-2019169102 A1 * | 9/2019 | ............... B23Q 3/15 |

OTHER PUBLICATIONS

The Office Action for Chinese Patent Application No. 201980006360.3, dated Nov. 17, 2023.

* cited by examiner (a)  (b)

FIG. 5

| Item | DIAMETER OF GROUND ELECTRODE | DIAMETER OF ELECTROSTATIC CHUCK ELECTRODE | TEMPERATURE RANGE AT WAFER EDGE |
|---|---|---|---|
| SHEET TYPE ELECTROSTATIC CHUCK ELECTRODE | Φ285 | Φ290~Φ320 | 3.7°C |
| | Φ280 | Φ285~Φ320 | 4.2°C |
| | Φ275 | Φ280~Φ320 | 4.8°C |
| MESH TYPE ELECTROSTATIC CHUCK ELECTRODE | Φ285 | Φ290~Φ320 | 2.7°C |
| | Φ280 | Φ285~Φ320 | 3.2°C |
| | Φ275 | Φ280~Φ320 | 4.6°C |

*GROUND ELECTRODE(24MESH)

ELECTROSTATIC CHUCK HEATER AND MANUFACTURING METHOD THEREFOR

CROSS-REFERENCE TO RELATED APPLICATIONS

The present application is a National Phase of International Application No.: PCT/KR2019/001029 filed on Jan. 24, 2019, which claims priority to Korean Patent Application No. 10-2018-0024661, filed on Feb. 28, 2018, based on the priority of the above patent, in the Korean Intellectual Property Office, the disclosures of each of which are incorporated herein by reference.

TECHNICAL FIELD

The present invention relates to an electrostatic chuck heater and a manufacturing method therefor, and particularly, to an electrostatic chuck heater that includes an electrostatic chuck electrode provided at a position spaced a predetermined distance apart from an outer side of a ground electrode in order to improve deposition uniformity on a wafer, and a method of manufacturing the electrostatic chuck heater.

BACKGROUND ART

A ceramic heater is used to heat-treat, at a predetermined heating temperature, a heat treatment subject such as a semiconductor wafer, a glass substrate, a flexible substrate, and the like for various purposes. The ceramic heater is sometimes combined with a function of an electrostatic chuck and used as an electrostatic chuck heater in order to treat the semiconductor wafer. Further, a ground electrode is sometimes embedded in order to remove a residual electric current produced in the ceramic heater while a thin film process is performed by the ceramic heater.

FIG. 1 is a view illustrating an example of an electrostatic chuck heater.

Referring to FIG. 1, a ceramic heater generally includes a ceramic plate that generates heat by being supplied with electric power from an external electrode. The ceramic plate 100 includes a heating element embedded in a ceramic sintered body and having predetermined resistance. Further, the ceramic plate may include a ground electrode and/or an electrostatic chuck electrode.

FIG. 2 is a view illustrating an example of a ceramic heater including a ground electrode in the related art.

Referring to FIG. 2, in the ceramic heater in the related art, a pocket having a wafer size is formed in an upper surface of the ceramic heater in order to secure a wafer. A vortex of gas is produced due to a level difference at a wafer edge when a process gas flows, which causes a problem of deterioration in deposition uniformity at the wafer edge. As a result, there is a problem in that temperature uniformity on the wafer also deteriorates.

DISCLOSURE

Technical Problem

An object of the present invention is to solve the above-mentioned problems and other problems.

Another object of the present invention is to provide an electrostatic chuck heater and a manufacturing method therefor, which increase deposition uniformity on a wafer and improve temperature uniformity by preventing a wafer edge from rising due to a gas flow during a process.

Technical Solution

In order to achieve the above-mentioned objects or other objects, an aspect of the present invention provides an electrostatic chuck heater including: a ground electrode; and an electrostatic chuck electrode spaced a predetermined distance apart from an outer side of the ground electrode.

Further, according to the aspect of the present invention, the ground electrode and the electrostatic chuck electrode may be provided on the same plane.

In addition, according to the aspect of the present invention, the electrostatic chuck electrode may be any one of a sheet type and a mesh type.

In addition, according to the aspect of the present invention, the ground electrode may have a circular plate shape having a diameter of 285 mm, and the electrostatic chuck electrode may have a ring shape having an inner diameter of 290 mm and an outer diameter of 320 mm.

In addition, according to the aspect of the present invention, the electrostatic chuck electrode may have a thickness of 0.2 mm.

In addition, the electrostatic chuck heater according to the aspect of the present invention may further include an electrostatic chuck connecting member for supplying electric power to the electrostatic chuck electrode, in which a material of the electrostatic chuck connecting member is molybdenum (Mo).

In addition, according to the aspect of the present invention, the electrostatic chuck connecting member may be any one of a sheet type and a mesh type.

Further, another aspect of the present invention provides a method of manufacturing an electrostatic chuck heater, the method including: forming a ceramic powder layer structure in which a ceramic molded body, in which a ground electrode and an electrostatic chuck electrode are embedded, is interposed between a first ceramic powder layer and a second ceramic powder layer; and sintering the ceramic powder layer structure, in which the electrostatic chuck electrode is spaced a predetermined distance apart from an outer side of the ground electrode.

In addition, according to the aspect of the present invention, the ceramic powder layer structure may further include a heating element between the second ceramic powder layer and the third ceramic powder layer.

In addition, according to the aspect of the present invention, the forming of the ceramic molded body may include: processing a molded body; providing an electrostatic chuck connecting member; providing a ground rod connecting member and an electrostatic chuck rod connecting member; and providing the ground electrode and the electrostatic chuck electrode.

In addition, according to the aspect of the present invention, the ground electrode and the electrostatic chuck electrode may be provided on the same plane.

In addition, according to the aspect of the present invention, the electrostatic chuck electrode may be any one of a sheet type and a mesh type.

In addition, according to the aspect of the present invention, the ground electrode may have a circular plate shape having a diameter of 285 mm, and the electrostatic chuck electrode may have a ring shape having an inner diameter of 290 mm and an outer diameter of 320 mm.

In addition, according to the aspect of the present invention, the electrostatic chuck electrode may have a thickness of 0.2 mm.

In addition, according to the aspect of the present invention, a material of the electrostatic chuck connecting member may be molybdenum (Mo).

In addition, according to the aspect of the present invention, the electrostatic chuck connecting member may be any one of a sheet type and a mesh type.

Advantageous Effects

According to the electrostatic chuck heater according to the present invention, the electrostatic chuck electrode embedded at the edge of the electrostatic chuck heater improves deposition uniformity on the wafer positioned on the upper portion of the electrostatic chuck, such that it is possible to uniformly apply heat to a heating surface of a subject such as a wafer. In other words, a temperature deviation for each position on a heating surface of a subject such as a wafer is significantly reduced by reducing the rising of a wafer edge caused by a gas flow during a process, such that it is possible to improve temperature uniformity on the heating surface.

DESCRIPTION OF DRAWINGS

FIG. 5 is a view illustrating measured ranges of changes in temperatures at wafer edges for respective types of electrostatic chuck electrodes of the electrostatic chuck heater, for respective diameters of ground electrodes, and for respective diameters of the electrostatic chuck electrodes according to the exemplary embodiment of the present invention.

BEST MODE

Figure 1:
FIG. 1 is a view illustrating an example of an electrostatic chuck heater.

Hereinafter, the present invention will be described in detail with reference to the accompanying drawings. In this case, the same constituent elements will be designated by the same reference numerals in the respective drawings. Further, a detailed description of a function and/or a configuration already publicly known will be omitted. The following disclosed contents will be described focusing on parts necessary for understanding operations of various exemplary embodiments, and the descriptions of constituent elements will be omitted if the descriptions may obscure the subject matter of the present invention. Further, some constituent elements may be exaggerated, omitted, or schematically illustrated in the drawings. A size of each constituent element does not entirely reflect an actual size. Therefore, the contents disclosed herein are not limited by relative sizes of or intervals between constituent elements illustrated in the drawings.

In addition, in the present invention, the term "stack" is used to refer to the relative positional relationship between respective layers. The expression "Layer B on Layer A" expresses the relative positional relationship between Layer A and Layer B, which does not necessarily require contact between Layer A and Layer B, and a third layer may be interposed therebetween. Similarly, the expression "Layer C interposed between Layer A and Layer B" does not exclude the interposition of a third layer between Layer A and Layer C or between Layer B and Layer C.

FIG. 1 is a view illustrating an example of an electrostatic chuck heater.

Referring to FIG. 1, a ceramic plate is provided at an upper side of an electrostatic chuck heater and has a circular plate shape in which a heating element, a ground electrode, and an electrostatic chuck electrode are embedded. Thermal energy generated by the heating element in the electrostatic chuck heater may be transferred to an upper surface of the ceramic plate, and thus the thermal energy may be transferred to a subject placed on an upper surface of the electrostatic chuck heater.

Figure 2:
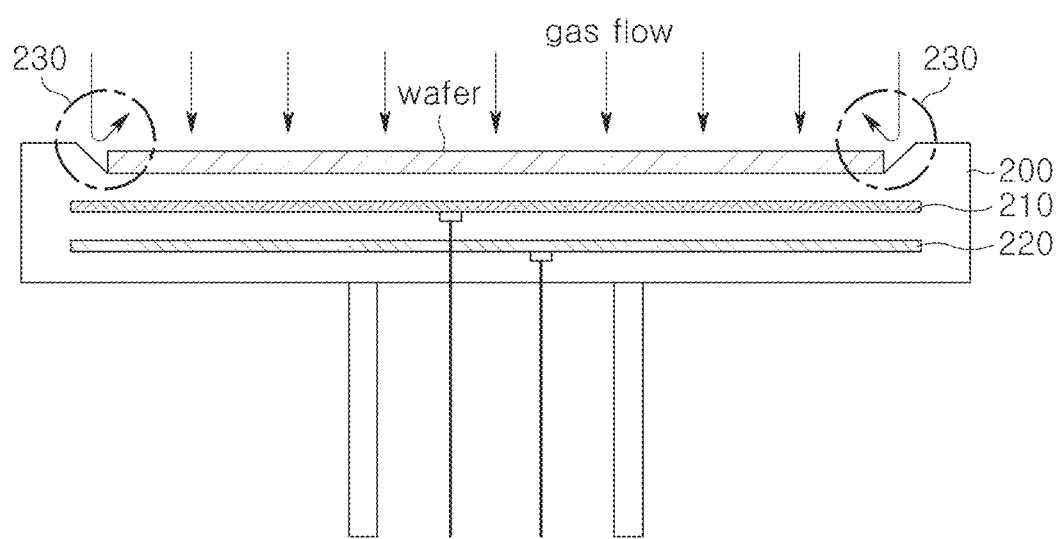
FIG. 2 is a view illustrating an example of a ceramic heater including a ground electrode in the related art.

FIG. 2 is a view illustrating an example of a ceramic heater including a ground electrode in the related art.

Referring to FIG. 2, a ceramic plate in the related art includes a ground electrode 210 and a heating element 220. A recessed space (pocket) may be formed in an upper portion of an electrostatic chuck heater so that a heating subject such as a wafer may be placed in the space. When heat is applied to the heating subject such as a wafer by the electrostatic chuck heater during a thin film process, a gas flow is not uniform in a chamber, a vortex of a gas flow is formed at a space portion 230 between the recessed space (pocket) of the electrostatic chuck heater and an outer edge of the wafer, and the vortex of the gas flow bends a wafer edge, which causes a deterioration in deposition uniformity at the wafer edge and a deterioration in temperature uniformity at the wafer edge.

Figure 3:
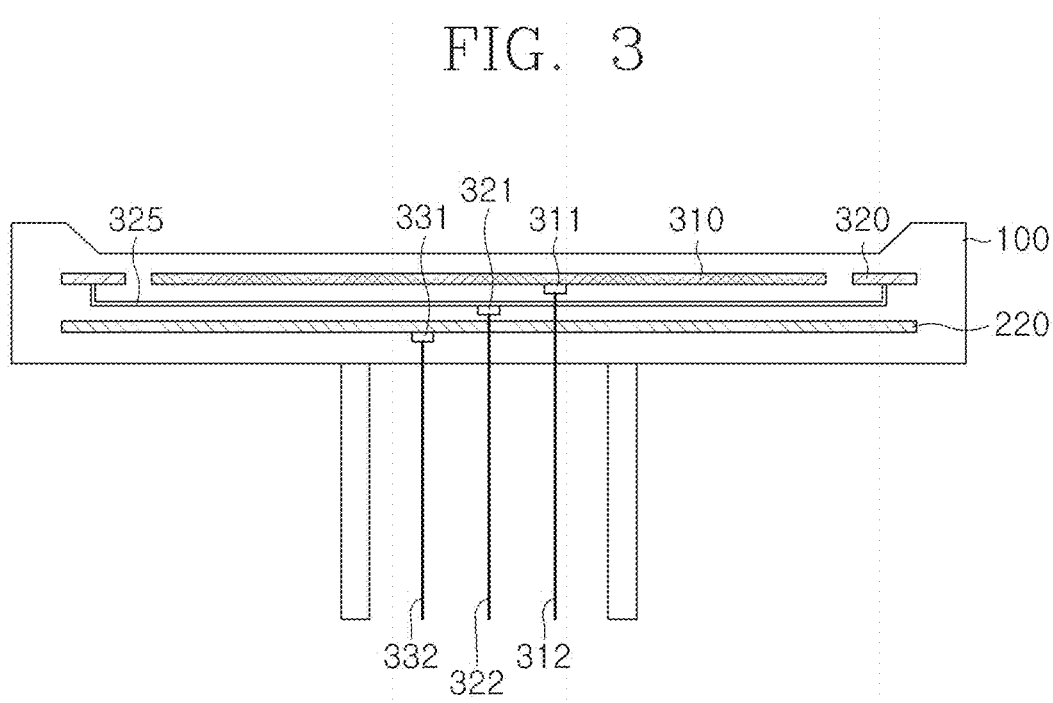
FIG. 3 is a cross-sectional view illustrating a structure of an electrostatic chuck heater according to an exemplary embodiment of the present invention.

FIG. 3 is a cross-sectional view illustrating a structure of an electrostatic chuck heater according to an exemplary embodiment of the present invention.

Referring to FIG. 3, the electrostatic chuck heater according to the exemplary embodiment of the present invention may include, in a ceramic plate 100, a ground electrode 310, an electrostatic chuck electrode 320, a heating element 220, an electrostatic chuck connecting member 325, rods 312, 322, and 332, and rod connecting members 311, 321, and 331.

The ceramic plate is charged when plasma is produced in a chamber during a wafer deposition process, and the ground electrode 310 serves to ground the ceramic plate charged with an electric current. The ground electrode 310 may have a circular plate shape and may be a mesh type and a sheet type. Further, a material of the ground electrode 310 may be molybdenum (Mo).

The electrostatic chuck electrode 320 serves to enable the charged heating subject such as a wafer to be appropriately attached to the ceramic plate. When a voltage is applied from the outside to the electrostatic chuck electrode 320, the heating subject such as a wafer positioned on an upper surface of the ceramic plate may be brought into close contact with the ceramic plate by the electrostatic chuck electrode 320 charged with the voltage. As a result, the thermal energy from the electrostatic chuck heater may be appropriately transferred to the heating subject such as a wafer.

Referring to FIG. 3, the electrostatic chuck electrode 320 may be provided on the same plane as the ground electrode 310. As an example, the ground electrode 310 may be formed in a circular plate shape at a center of the ceramic plate, and the electrostatic chuck electrode 320 may be formed outside the ground electrode 310 and disposed at a position spaced a predetermined distance apart from the ground electrode 310. The electrostatic chuck electrode 320 may have a ring shape and may be a mesh type or a sheet type. Further, a material of the electrostatic chuck electrode 320 may be molybdenum (Mo). Further, a thickness of the electrostatic chuck electrode 320 may be 0.2 mm.

Further, the ground electrode 310 and the electrostatic chuck electrode 320, which are provided on the same plane, may have various sizes. In a case in which the ground electrode 310 has a circular plate shape having a diameter of 285 mm, the electrostatic chuck electrode 320 may have a ring shape having a diameter in the range of 280 mm to 320 mm.

The configuration of the electrostatic chuck heater will be described with reference back to FIG. 3. The electrostatic chuck heater may further include the heating element 220 and include the ground rod connecting member 311, the electrostatic chuck rod connecting member 321, and the heating element rod connecting member that connect the ground electrode 310, the electrostatic chuck electrode 320, and the heating element 220 to the ground rod 312, the electrostatic chuck rod 322, and the heating element rod. Further, since the electrostatic chuck electrode 320 is provided on the same plane as the ground electrode 310 and disposed at the position spaced a predetermined distance apart from an outer side the ground electrode 310, it is difficult to connect the electrostatic chuck electrode 320 directly to the electrostatic chuck rod 322 provided at the center of the ceramic plate. Therefore, the ceramic plate may include the electrostatic chuck connecting member 325 for electrically connecting the electrostatic chuck electrode 320 and the electrostatic chuck rod 322. The material of the electrostatic chuck connecting member 325 may be molybdenum (Mo), and the electrostatic chuck connecting member 325 may be any one of a sheet type and a mesh type. With the electrostatic chuck connecting member 325, the electrostatic chuck rod 322 positioned at the center of the ceramic plate may be electrically connected to the electrostatic chuck electrode 320 having a ring shape and disposed at the edge of the ceramic plate. Therefore, the rods for the ground electrode 310, the electrostatic chuck electrode 320, and the heating element 220 included in the ceramic plate may be positioned together at the center of the electrostatic chuck heater.

According to the electrostatic chuck heater according to the present invention, the portion of the heating subject such as a wafer is divided into an inner portion where deposition uniformity is good and an outer portion where deposition uniformity is not good, and the electrostatic chuck electrode 320 is provided at an outer portion of the electrostatic chuck heater, such that the charged heating subject such as a wafer may be fixed to the electrostatic chuck heater.

As a result, a contact surface of the edge of the heating subject such as a wafer and a contact surface of the electrostatic chuck heater are increased, such that thermal conductivity is improved and deposition uniformity and temperature uniformity at the edge of the heating subject such as a wafer are improved.

Figure 4:
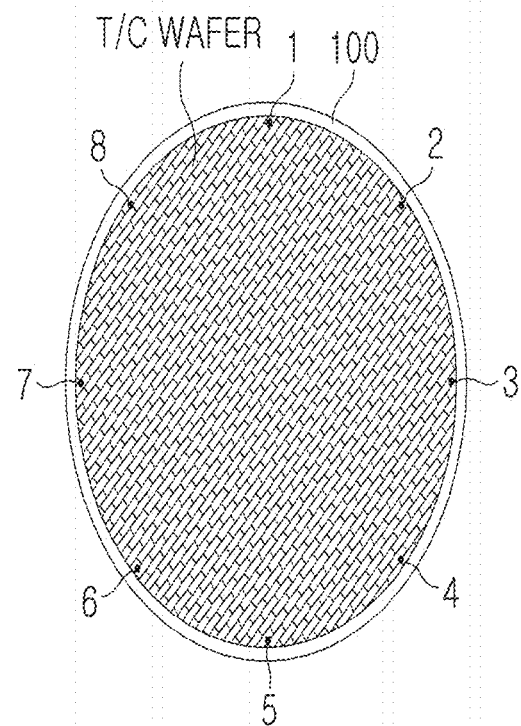
FIG. 4 is a graph illustrating measured edge temperatures of the ceramic heater in the related art and the electrostatic chuck heater according to the present invention.
Figure 4:
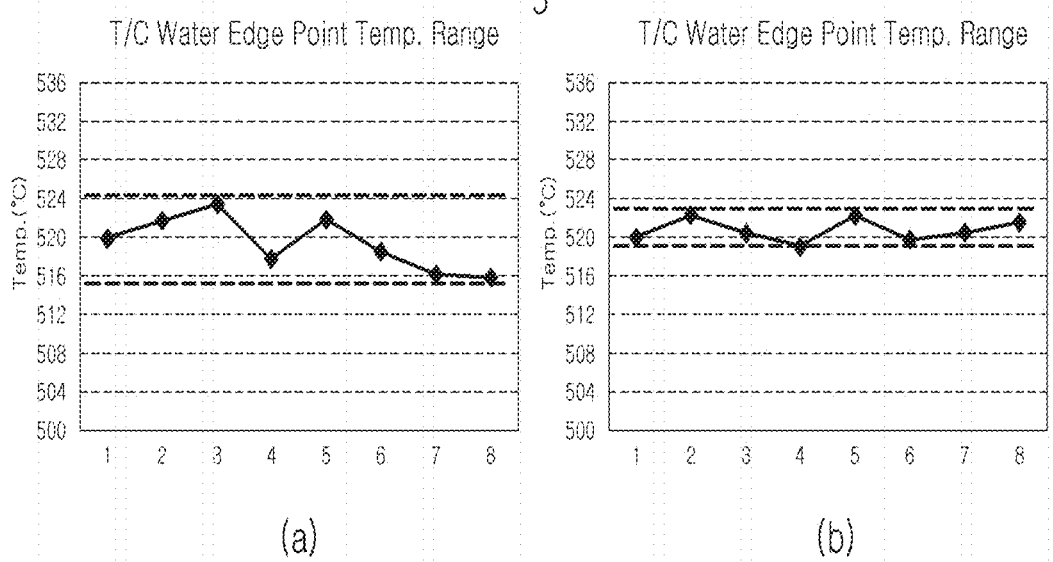

FIG. 4 is a graph illustrating measured edge temperatures of the ceramic heater in the related art and the electrostatic chuck heater according to the present invention.

In order to test the effect of the present invention, a T/C wafer was used, temperatures were measured at eight portions at the edge of the heater, and then the temperatures were compared. A setting temperature for each heater was set to 550 degrees. A mesh type (24-mesh) electrode having a diameter of 320 mm was used and tested as the ground electrode 310 in the ceramic heater in the related art. A mesh type (24-mesh) electrode having a diameter of 285 mm was used and tested as the ground electrode 310 of the electrostatic chuck heater according to the present invention, and a mesh type (24-mesh) electrode having a ring shape having a diameter of 290 to 320 mm was used and tested as the electrostatic chuck electrode 320.

As a result, a temperature range of the ceramic heater in the related art was about 7.5 degrees, and a temperature range of the electrostatic chuck heater according to the present invention was about 2.7 degrees. It was ascertained that the range of change in temperatures at the edge of the heater is greatly reduced in the electrostatic chuck heater according to the present invention in comparison with that in the ceramic heater in the related art. Specifically, it was ascertained that the range of change in temperatures is reduced by 36% than the range in the related art.

The deposition uniformity at the edge of the electrostatic chuck heater according to the present invention is greatly improved in comparison with the deposition uniformity at the edge of the ceramic heater in the related art, and thus the uniformity of thermal energy applied to the heating subject such as a wafer is also greatly improved.

FIG. 5 is a view illustrating measured ranges of changes in temperatures at wafer edges for respective types of electrostatic chuck electrodes 320 of the electrostatic chuck heater, for respective diameters of the ground electrodes 310, and for respective diameters of the electrostatic chuck electrodes 320 according to the exemplary embodiment of the present invention.

In this test, a mesh type (24-mesh) electrode was used as the ground electrode 310, and the electrodes having diameters of 275 mm, 280 mm, and 285 mm were used and tested. Further, a sheet type electrode and a mesh type (24-mesh) electrode having a ring shape were used as the electrostatic chuck electrode 320, and the electrodes having diameters (the inner diameter to the outer diameter) of 280 mm to 320 mm, 285 mm to 320 mm, and 290 mm to 320 mm were used.

As a result, the range of change in temperatures at the wafer edge was smallest as 2.7 degrees when the diameter of the ground electrode 310 was 285 mm, the electrostatic chuck electrode 320 was the mesh type (24-mesh), and the diameters (the inner diameter to the outer diameter) of the electrostatic chuck electrode 320 were 290 mm to 320 mm. In other words, the deposition uniformity and the temperature uniformity on the electrostatic chuck heater were best in the above-mentioned condition.

Figure 6:
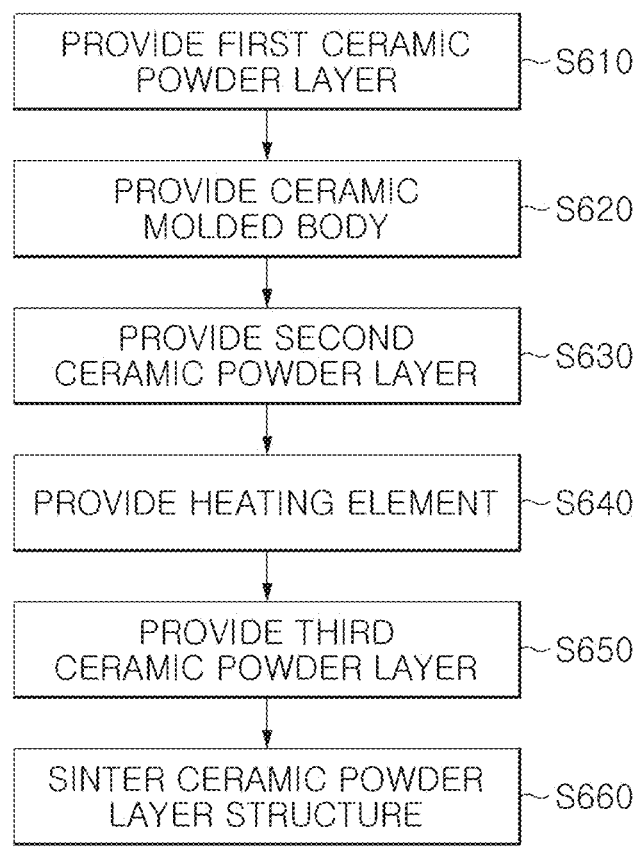
FIG. 6 is a flowchart illustrating a method of manufacturing the electrostatic chuck heater according to the exemplary embodiment of the present invention.

FIG. 6 is a flowchart illustrating a method of manufacturing the electrostatic chuck heater according to the exemplary embodiment of the present invention.

Figure 7:
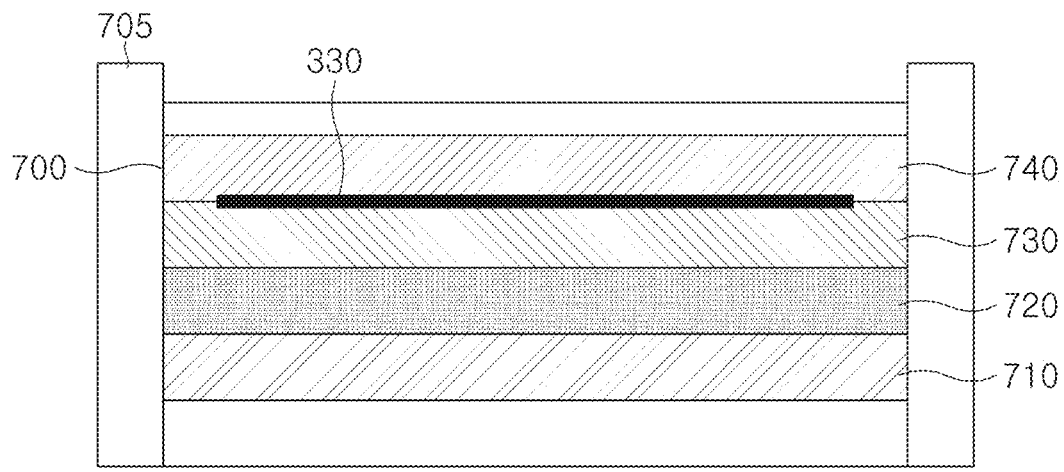
FIG. 7 is a view for explaining the method of manufacturing the electrostatic chuck heater according to the exemplary embodiment of the present invention.

FIG. 7 is a view for explaining the method of manufacturing the electrostatic chuck heater according to the exemplary embodiment of the present invention.

Hereinafter, the method of manufacturing the electrostatic chuck heater according to the present invention illustrated in FIG. 6 will be described in detail with reference to FIG. 7.

A first ceramic powder layer 710 is provided in a carbon mold 705 (S610), and a ceramic molded body 720, in which the ground electrode 310 and the electrostatic chuck electrode 320 are embedded, is provided (S620). Thereafter, a second ceramic powder layer 730 is provided (S630), the heating element 220 is provided (S640), and then a third ceramic powder layer 740 is provided (S740). In this case, the ceramic molded body 720 may be provided in the form of a molded body pressed with a predetermined pressure in order to maintain its shape. Of course, the entire ceramic powder layer structure 700 may be provided in the form of a press-molded body. Finally, the formed ceramic powder layer structure is sintered (S660).

Figure 8:
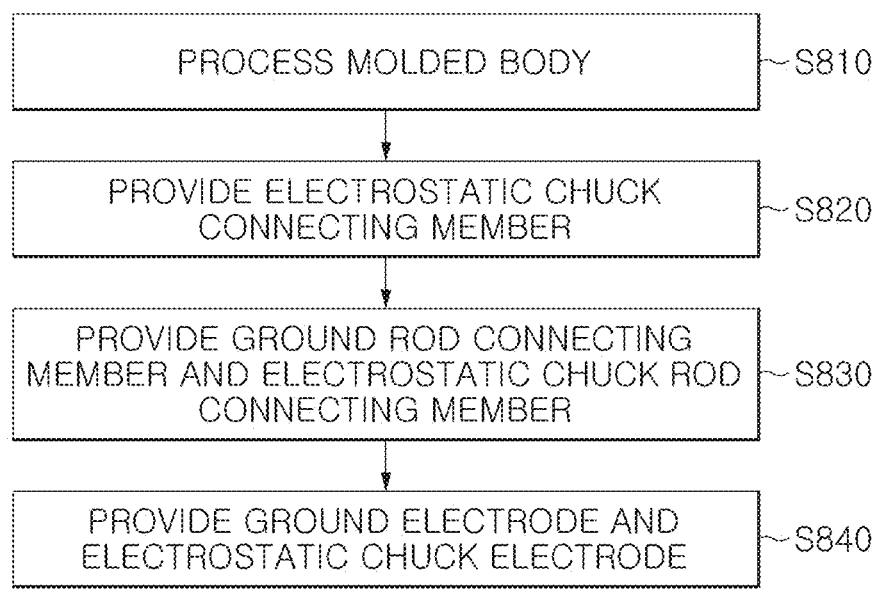
FIG. 8 is a flowchart illustrating a method of manufacturing a ceramic molded body according to the exemplary embodiment of the present invention.

FIG. 8 is a flowchart illustrating a method of manufacturing a ceramic molded body according to the exemplary embodiment of the present invention.

FIGS. 9 to 13 are views for explaining the method of manufacturing the ceramic molded body according to the exemplary embodiment of the present invention.

Hereinafter, the method of manufacturing the ceramic molded body according to the exemplary embodiment of the present invention illustrated in FIG. 8 will be described in detail with reference to FIGS. 9 to 13.

Figure 9:
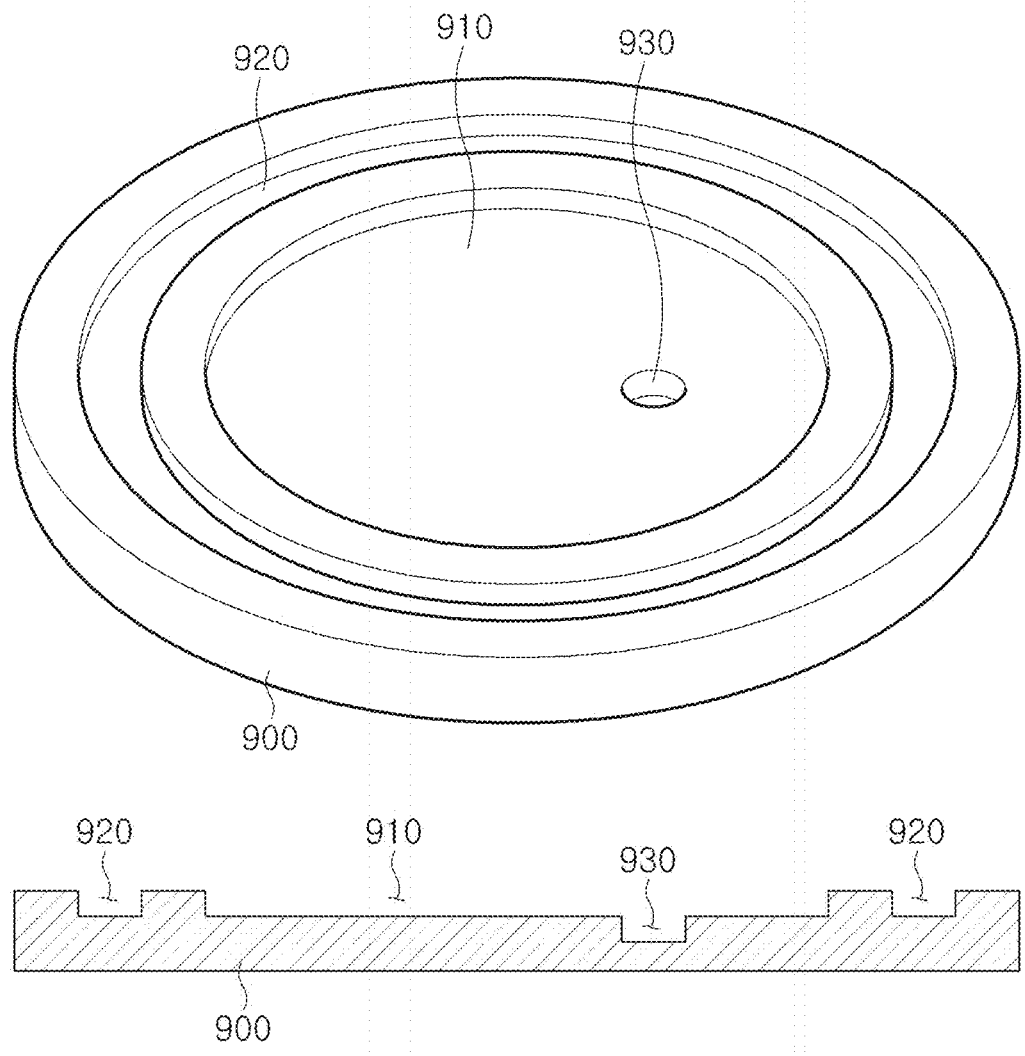
FIGS. 9 to 13 are views for explaining the method of manufacturing the ceramic molded body according to the exemplary embodiment of the present invention.

First, a molded body 900 is processed so that a groove 910, in which the ground electrode 310 may be embedded, is formed at an inner side of an upper surface of the molded body 900, a groove 920, in which the electrostatic chuck electrode 320 may be embedded, is formed at an outer side of the upper surface of the molded body 900, and a groove 930, in which the ground rod connecting member 311 may be embedded, is formed at a particular site at a center of the groove 910 in which the ground electrode 310 may be embedded, such that the ground electrode 310 and the electrostatic chuck electrode 320 are provided on the same plane in the ceramic plate (S810, FIG. 9).

Figure 10:
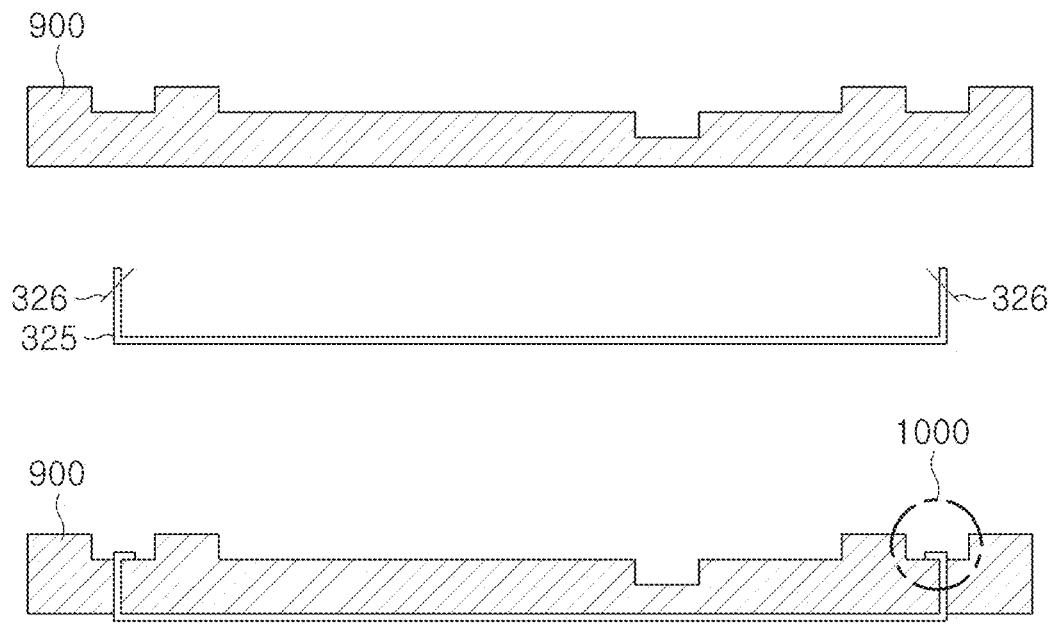
Figure 11:
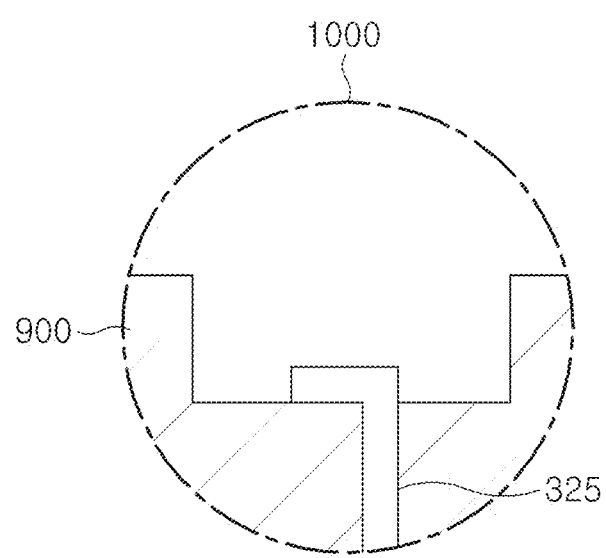

Thereafter, the electrostatic chuck connecting member 325 is provided in the molded body 900 (S820, FIG. 10). The electrostatic chuck connecting member 325 may have a thin and long plate shape processed to have a '⊏' shape and may be inserted into the molded body 900 so as to vertically penetrate the molded body 900, as illustrated in FIG. 10. Thereafter, both ends of the electrostatic chuck connecting member 325 may be bent inward or outward along bending lines 326 and disposed in parallel with the molded body 900 at the position at which the electrostatic chuck electrode 320 is embedded, such that the electrostatic chuck connecting member 325 may be electrically connected to the electrostatic chuck electrode 320 (1000). FIG. 10 illustrates in more detail a state (1000) in which the electrostatic chuck connecting member 325 illustrated in FIG. 9 is bent inward or outward along the bending lines 326 and disposed in parallel with the molded body 900. A material of the electrostatic chuck connecting member 325 may be molybdenum (Mo), and the electrostatic chuck connecting member 325 may be any one of a sheet type and a mesh type.

Figure 12:
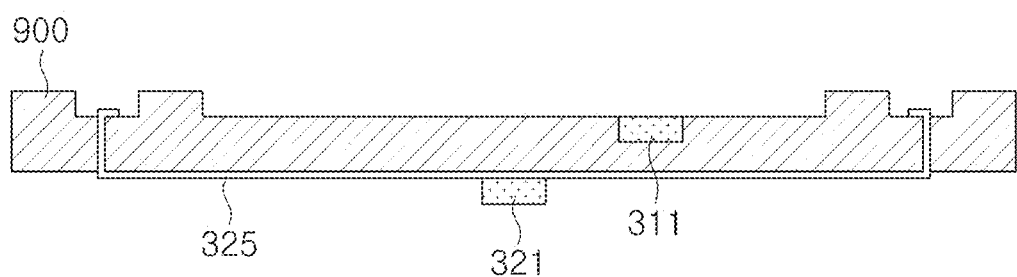

Thereafter, the ground rod connecting member 311 and the electrostatic chuck connecting member 325 may be provided (S830, FIG. 12).

Figure 13:
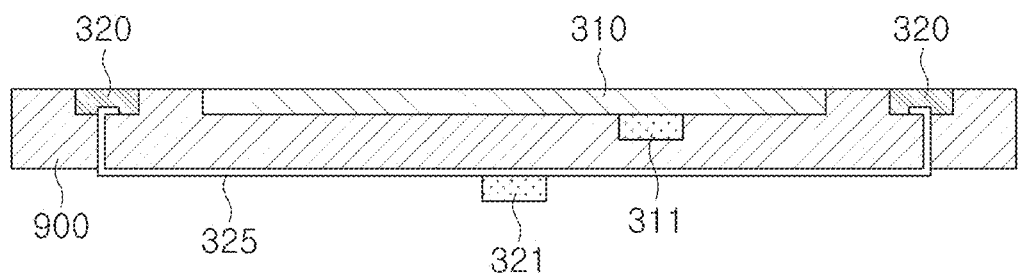

Further, the ground electrode 310 and the electrostatic chuck electrode 320 are provided (S840, FIG. 13). The ground electrode 310 may be formed to be brought into contact with and electrically connected to the ground rod connecting member 311, and the electrostatic chuck electrode 320 may be formed to be brought into contact with and electrically connected to the electrostatic chuck connecting member 325.

The ground electrode 310 may have a circular plate shape and may be a mesh type and a sheet type. Further, a material of the ground electrode 310 may be molybdenum (Mo).

The electrostatic chuck electrode 320 may have a ring shape and may be a mesh type or a sheet type. Further, a material of the electrostatic chuck electrode 320 may be molybdenum (Mo). Further, a thickness of the electrostatic chuck electrode 320 may be 0.2 mm.

Figure 14:
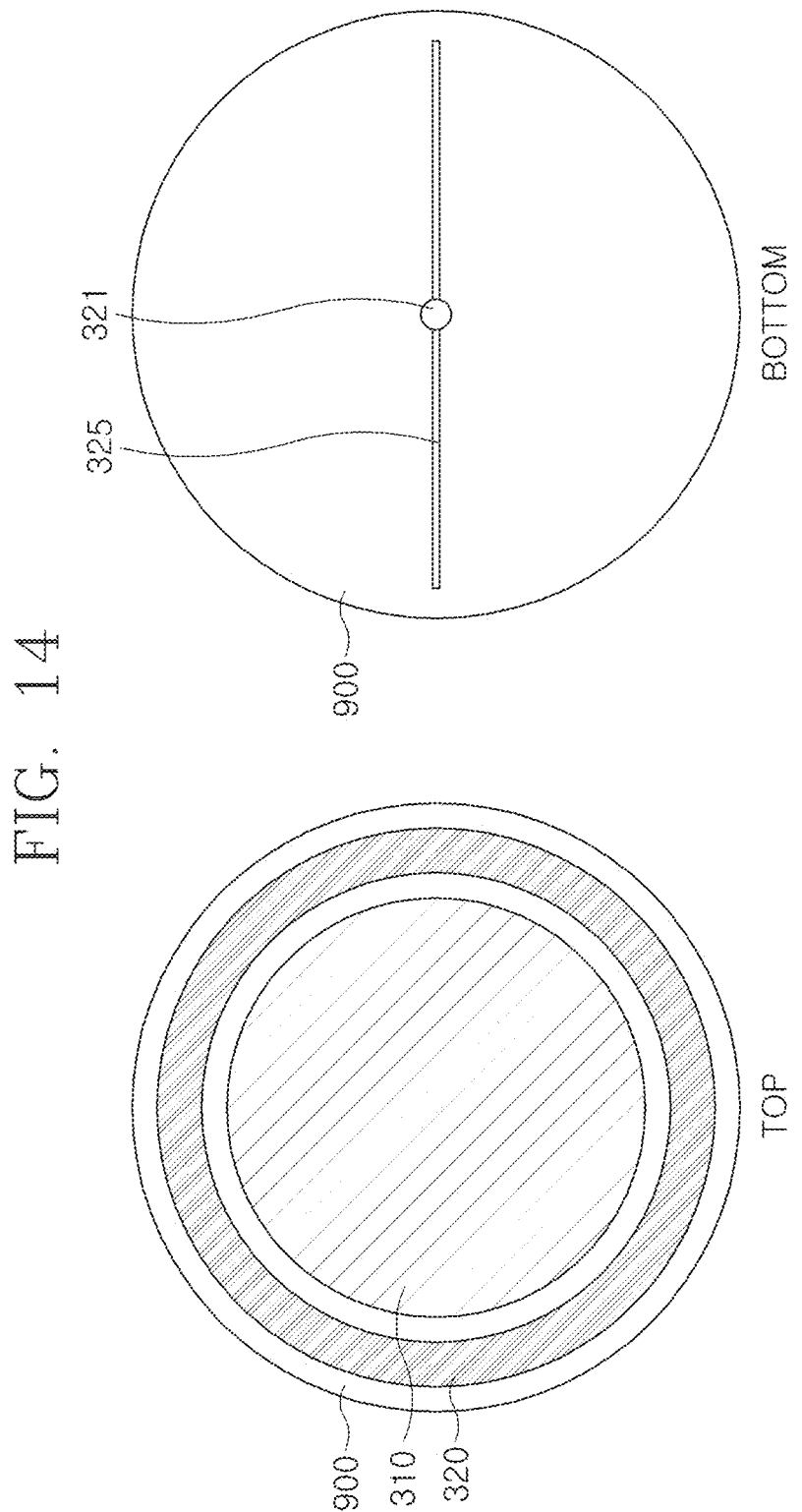
FIG. 14 is a view illustrating shapes of top and bottom sides of the ceramic molded body according to the exemplary embodiment of the present invention.

FIG. 14 is a view illustrating shapes of top and bottom sides of the ceramic molded body according to the exemplary embodiment of the present invention.

FIG. 14 illustrates the molded body 900 completely formed by the manufacturing method illustrated in FIGS. 8 to 13. The ground electrode 310 and the electrostatic chuck electrode 320 are provided on the upper surface of the molded body 900, and the electrostatic chuck connecting member 325, which may electrically connect the electrostatic chuck electrode 320 and the electrostatic chuck rod connecting member 321 on the upper surface of the molded body 900, is provided on a lower surface of the molded body.

According to the electrostatic chuck heater according to the present invention, the contact surface of the edge of the heating subject such as a wafer and the contact surface of the electrostatic chuck heater are increased by chucking, such that thermal conductivity is improved and deposition uniformity and temperature uniformity at the edge of the heating subject such as a wafer are improved.

While the present invention has been described above with reference to particular contents such as specific constituent elements, the limited exemplary embodiments, and the drawings, but the exemplary embodiments are provided merely for the purpose of helping understand the present invention overall, and the present invention is not limited to the exemplary embodiment, and may be variously modified and altered without departing intrinsic features of the present invention. Accordingly, the spirit of the present invention should not be limited to the described exemplary embodiment, and all of the equivalents or equivalent modifications of the claims as well as the appended claims belong to the scope of the present invention.

The invention claimed is:

1. An electrostatic chuck heater comprising:
a ceramic plate including a ground electrode; and
an electrostatic chuck electrode spaced a predetermined distance apart from an outer side of the ground electrode,
wherein an electrostatic chuck electrode connecting member is connected to the electrostatic chuck electrode, and is embedded in the ceramic plate,
wherein the electrostatic chuck electrode connecting member is positioned on a first plane that is different from and parallel to a second plane on which the electrostatic chuck electrode is positioned.

2. The electrostatic chuck heater of claim 1, wherein the ground electrode and the electrostatic chuck electrode are provided on the same plane.

3. The electrostatic chuck heater of claim 1, wherein the electrostatic chuck electrode is any one of a sheet type and a mesh type.

4. The electrostatic chuck heater of claim 1, wherein the ground electrode has a circular plate shape having a diameter of 285 mm, and the electrostatic chuck electrode has a ring shape having an inner diameter of 290 mm and an outer diameter of 320 mm.

5. The electrostatic chuck heater of claim 1, wherein the electrostatic chuck electrode has a thickness of 0.2 mm.

6. The electrostatic chuck heater of claim 1, further comprising:
the electrostatic chuck connecting member for supplying electric power to the electrostatic chuck electrode,
wherein a material of the electrostatic chuck connecting member is molybdenum (Mo).

7. The electrostatic chuck heater of claim 6, wherein the electrostatic chuck connecting member is any one of a sheet type and a mesh type.

8. The electrostatic chuck heater of claim 1, wherein the electrostatic chuck connecting member is connected to an electrostatic chuck rod positioned at a center region of the electrostatic chuck heater.

9. A method of manufacturing an electrostatic chuck heater, the method comprising:
forming a ceramic powder layer structure in which a ceramic molded body, in which a ground electrode and an electrostatic chuck electrode are embedded, is interposed between a first ceramic powder layer and a second ceramic powder layer; and
sintering the ceramic powder layer structure,
wherein the electrostatic chuck electrode is spaced a predetermined distance apart from an outer side of the ground electrode.

10. The method of claim 9, wherein the ceramic powder layer structure further comprises a heating element between the second ceramic powder layer and a third ceramic powder layer.

11. The method of claim 9, wherein the forming of the ceramic molded body comprises:
processing a molded body;
providing an electrostatic chuck connecting member;
providing a ground rod connecting member and an electrostatic chuck rod connecting member; and
providing the ground electrode and the electrostatic chuck electrode.

12. The method of claim 11, wherein the ground electrode and the electrostatic chuck electrode are provided on the same plane.

13. The method of claim 11, wherein the electrostatic chuck electrode is any one of a sheet type and a mesh type.

14. The method of claim 11, wherein the ground electrode has a circular plate shape having a diameter of 285 mm, and the electrostatic chuck electrode has a ring shape having an inner diameter of 290 mm and an outer diameter of 320 mm.

15. The method of claim 11, wherein the electrostatic chuck electrode has a thickness of 0.2 mm.

16. The method of claim 11, wherein a material of the electrostatic chuck connecting member is molybdenum (Mo).

17. The method of claim 11, wherein the electrostatic chuck connecting member is any one of a sheet type and a mesh type.

18. The method of claim 9, wherein the forming further comprises positioning an electrostatic chuck connecting member in a different plane from that where the electrostatic chuck electrode is embedded, and connecting the electrostatic chuck connecting member to the electrostatic chuck electrode.

19. An electrostatic chuck heater comprising:
a ground electrode;
an electrostatic chuck electrode spaced a predetermined distance apart from an outer side of the ground electrode; and
an electrostatic chuck connecting member for supplying electric power to the electrostatic chuck electrode,
wherein a material of the electrostatic chuck connecting member is molybdenum (Mo).

* * * * *